United States Patent
Fujii et al.

(10) Patent No.: US 8,503,493 B1
(45) Date of Patent: Aug. 6, 2013

(54) SYSTEM AND METHOD FOR COOLING A SEMICONDUCTOR LIGHT SOURCE BAR DURING BURN-IN TESTING

(75) Inventors: Ryuji Fujii, Hong Kong (CN); Quan Bao Wang, Hong Kong (CN); Chun Fei Cheung, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 0 days.

(21) Appl. No.: 13/525,648

(22) Filed: Jun. 18, 2012

(51) Int. Cl.
*H01S 3/04* (2006.01)
*H01S 5/00* (2006.01)

(52) U.S. Cl.
USPC .......................................... 372/35; 372/50.12

(58) Field of Classification Search
USPC ................................................. 372/35, 50.12
See application file for complete search history.

(56) References Cited

U.S. PATENT DOCUMENTS

2013/0003764 A1\* 1/2013 Kress ............................... 372/35

\* cited by examiner

*Primary Examiner* — Armando Rodriguez
(74) *Attorney, Agent, or Firm* — Nixon & Vanderhye P.C.

(57) ABSTRACT

A system for cooling a semiconductor light source bar during burn-in testing includes a fixture for holding the semiconductor light source bar, and the fixture including a housing having a water inlet channel and a water outlet channel communicated with the water inlet channel; a first water tank with coolant connected with the water inlet channel; a second water tank connected with the water outlet channel; and a pumping device at least connected with the water outlet channel for pumping the coolant from the first water tank to the second water tank, thereby rushing a bottom of the semiconductor light source bar to lower the temperature thereof. The system can disperse the local heat generated during burn-in testing and uniform the local temperature of the semiconductor light source bar, thereby maintaining a proper temperature during burn-in testing and improving the heat stability of the heat assist magnetic recording head.

9 Claims, 6 Drawing Sheets

SYSTEM AND METHOD FOR COOLING A SEMICONDUCTOR LIGHT SOURCE BAR DURING BURN-IN TESTING

FIELD OF THE INVENTION

The present invention relates to a system and a method for cooling a semiconductor light source bar and, more particularly, to a system and a method for cooling a laser diode bar used in heat assist magnetic recording (HAMR) device during burn-in testing.

BACKGROUND OF THE INVENTION

Hard disk drives are common information storage devices. FIG. 1a provides an illustration of a typical disk drive unit 100 essentially consisting of a series of rotatable disks 101 mounted on a spindle motor 102, and a Head Stack Assembly (HSA) 130 which is rotatable about an actuator arm axis 105 for accessing data tracks on disks during seeking. The HSA 130 includes at least one drive arm 104 a head gimbal assembly (HGA) 150. Typically, a spindling voice-coil motor (VCM) is provided for controlling the motion of the drive arm 104.

Referring to FIG. 1b, the HGA 150 includes a slider 103 having a HAMR head (not shown), and a suspension 190 to load or suspend the slider 103 thereon. The suspension 190 includes a load beam 106, a base plate 108, a hinge 107 and a flexure 109, all of which are assembled together. A write transducer and a read transducer (not shown) are embedded in the pole tip of the slider 103 for writing and reading data. When the disk drive is on, a spindle motor 102 will rotate the disk 101 at a high speed, and the slider 103 will fly above the disk 101 due to the air pressure drawn by the rotated disk 101. The slider 103 moves across the surface of the disk 101 in the radius direction under the control of the VCM. With a different track, the slider 103 can read data from or write data to the disk 101.

This HAMR head is an improve magnetic head which applies a thermal energy source (a semiconductor light source generally), such as a laser diode at or near the location of the write transducer. This thermal energy source provides heat energy or light energy to the recording medium, which reduces the medium's coercivity to facilitate the writing process. Concretely, as the coercivity is reduced, thus the magnetization directions of the recording medium are changed by the magnetic field of the magnetic head, so that the data can be recorded. The HAMR head can use smaller magnetic particle, and larger magnetic anisotropy can be obtain at room temperature, so as to ensure a sufficient heat stability required when recording on an increased surface density. Therefore, this HAMR head becomes more and more desirable.

Commonly, it's necessary for the semiconductor light source to perform several testing before it is used in the magnetic head, such as burn-in testing which is needed to apply heat energy thereon. Conventionally, the burn-in testing is carried out in chip level, that is, the semiconductor light source bar is cut into separated semiconductor light source chip firstly, and then the semiconductor light source chips will be tested one by one. However, the testing efficiency is quite low, which is not desired by manufacturers. In view of this drawback, an efficient testing method was developed. The burn-in testing is performed in bar level, namely the burn-in testing is carried out on the semiconductor light source bar directly before cut into separated chips, which can improve efficiency significantly. However, a new issue of temperature uniformity is generated. Due to local heat will be generated and accumulated in the semiconductor light source bar during burn-in testing, which causes temperature uneven across the semiconductor light source bar and the heat could not be dissipated properly. As the local temperature of the semiconductor light source bar, such as the laser diode bar increases, on one hand, the conversion efficiency of electrical input to optical output falls so that, for a fixed electrical input, laser output declines. On the other hand, as the local temperature of the laser diode increases, the temperature required in the burn-in testing can not be achieved, which affects the testing result or damages the laser diode bar and, in turns affects the performance of the HAMR head.

Thus, there is a need for an improved system and method for cooling the semiconductor light source bar during burn-in testing that do not suffer from the above-mentioned drawbacks.

SUMMARY OF THE INVENTION

One aspect of the present invention is to provide a system for cooling a semiconductor light source bar during burn-in testing, which can disperse the local heat generated during burn-in testing and uniform the local temperature of the semiconductor light source bar, thereby maintaining a proper temperature during burn-in testing and improving the heat stability of the HAMR head.

Another aspect of the present invention is to provide a method for cooling a semiconductor light source bar during burn-in testing, which can disperse the local heat generated during burn-in testing and uniform the local temperature of the semiconductor light source bar, thereby maintaining a proper temperature during burn-in testing and improving the heat stability of the HAMR head.

To achieve above objectives, the present invention provides a system for cooling a semiconductor light source bar during burn-in testing, which includes a fixture for fixing and holding the semiconductor light source bar, and the fixture including a housing having a water inlet channel and a water outlet channel communicated with the water inlet channel; a first water tank with coolant connected with the water inlet channel; a second water tank connected with the water outlet channel; and a pumping device at least connected with the water outlet channel for pumping the coolant from the first water tank to the second water tank, thereby rushing a bottom of the semiconductor light source bar to lower the temperature thereof.

As an exemplary embodiment, a through hole is formed on the housing and communicated with the water outlet channel, and a support post is extended from the water outlet channel and located opposite the through hole; the semiconductor light source bar is supported by the support post.

Preferably, the bottom of the semiconductor light source bar is faced to the support post; and a top of the semiconductor light source bar is connected to a probe to carry out the burn-in testing.

As another exemplary embodiment, the pumping device includes a first pumping device connected with the water outlet channel and the second water tank for pumping the coolant from the first water tank to the second water tank, and a second pumping device formed between the first water tank and the second tank for pumping the coolant from the second water tank to the first water tank.

Preferably, the system further includes at least one control switch for controlling the alternate use between the first pumping device and the second pumping device.

Preferably, the semiconductor light source bar is laser diode bar or ultraviolet source bar.

Accordingly, the present invention provides a method for cooling a semiconductor light source bar during burn-in testing, which includes steps of providing a fixture including a housing having a water inlet channel and a water outlet channel communicated with the water inlet channel; providing a first water tank with coolant connected with the water inlet channel, and a second water tank connected with the water outlet channel; fixing the semiconductor light source bar on a fixture and communicated with the water outlet channel; and pumping air within the fixture so as to pump the coolant water from the first water tank to the second water tank, thereby rushing a bottom of the semiconductor light source bar to lower the temperature thereof.

Preferably, the method further includes pumping the coolant from the second water tank to the first water tank when all coolant is pumped to the second water tank.

Preferably, the semiconductor light source bar is laser diode bar or ultraviolet source bar.

Compared with the prior art, when the cooling system of the present invention works, the coolant in the first water tank is pumped through the water inlet channel and the water outlet channel in turns, and finally infused into the second water tank. When the coolant flows through the water outlet channel continuously, as the semiconductor light source bar is connected with the water outlet channel, thus the bottom of the semiconductor light source bar may be rushed and washed by the coolant continuously. As a result, a local heat of the semiconductor light source bar generated during the burn-in testing can be dispersed quickly, and the local high temperature of the semiconductor light source bar can be decreased and more uniform. Therefore, electronic products such as an HAMR having such a semiconductor light source chip can obtain improved heat stability. As a result, the burn-in testing is performed in semiconductor light source bar level not in chip level, which can improve testing efficiency significantly.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1A:
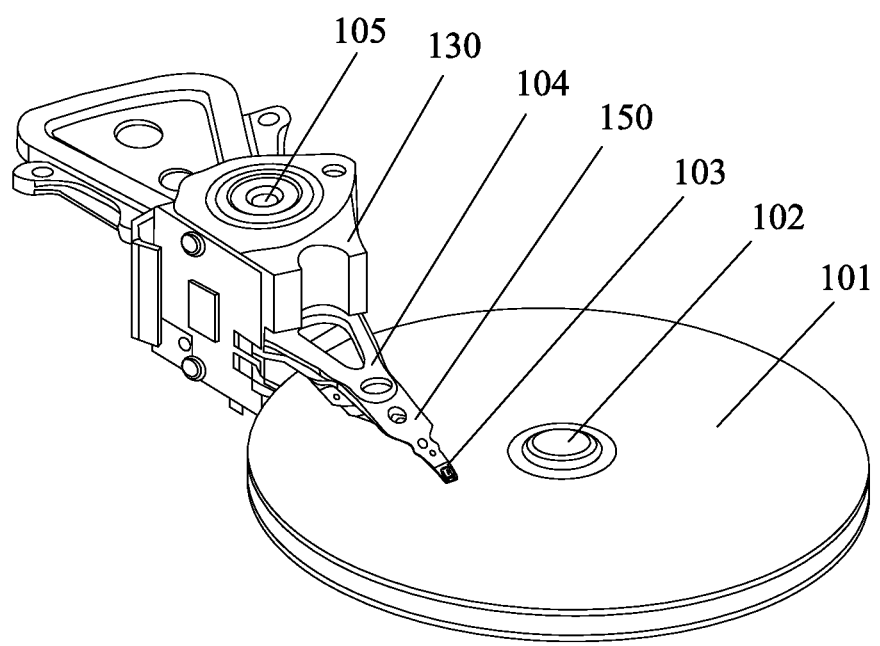
FIG. 1a is a perspective view of a conventional disk drive unit.
Figure 1B:
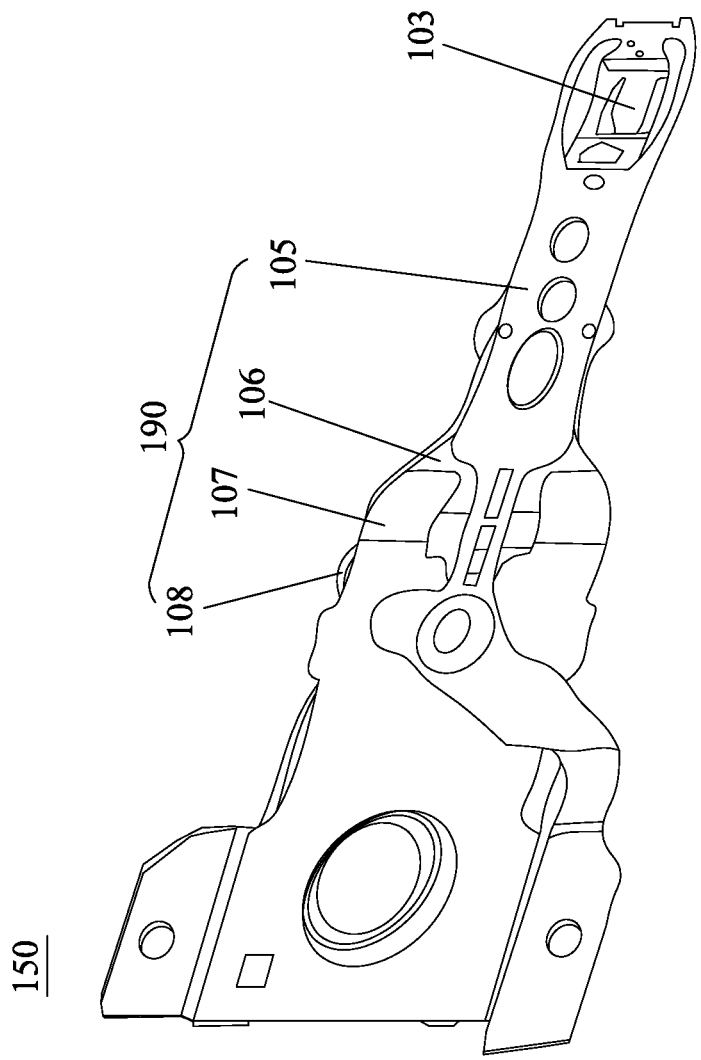
FIG. 1b is a perspective view of a conventional HGA.

Various preferred embodiments of the invention will now be described with reference to the figures, wherein like reference numerals designate similar parts throughout the various views. As indicated above, the invention is directed to a system and a method for cooling a semiconductor light source bar during burn-in testing, which can disperse the local heat generated during burn-in testing and uniform the local temperature of the semiconductor light source bar, thereby maintaining a proper temperature during burn-in testing and improving the heat stability of the HAMR head.

Figure 2A:
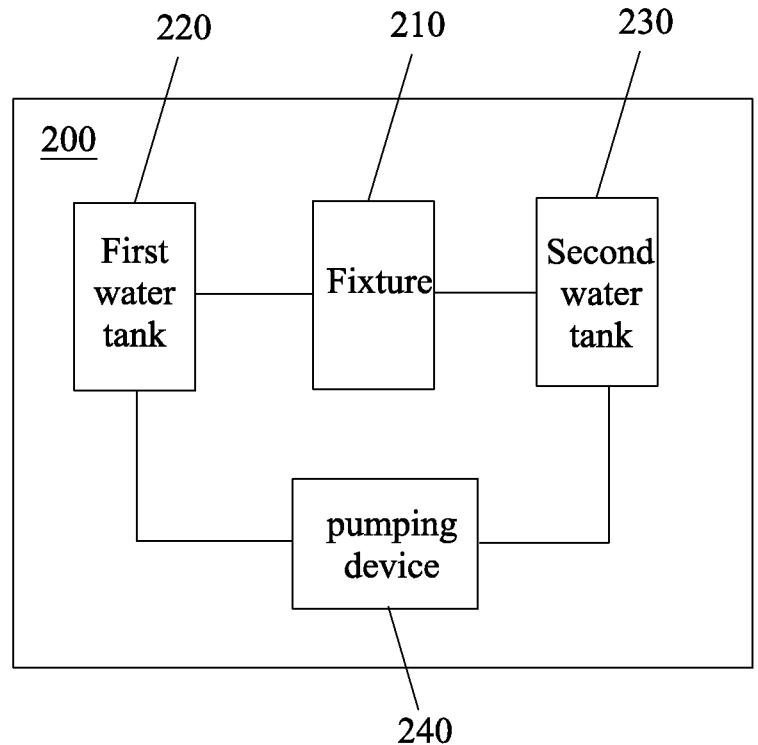
FIG. 2a is a schematic view of a system for cooling a semiconductor light source bar during burn-in testing according to a first embodiment of the present invention.

FIG. 2a is a schematic view of a system for cooling a semiconductor light source bar during burn-in testing according to a first embodiment of the present invention. As shown, the system 200 includes a fixture 210 for fixing and holding the semiconductor light source bar 201 (referring to FIG. 3), a first water tank 220 with coolant connected with the fixture 210, a second water tank 230 connected with fixture 210 and the first water tank 220, and a pumping device 240 for pumping the coolant from the first water tank 220 to the second water tank 220, thereby rushing the bottom of the semiconductor light source bar 201. Concretely, the coolant in the first water tank 220 can be any cooling fluid or cooling water with required temperature. Specifically, before the system 200 works, the second water tank 230 is empty.

As an embodiment, the coolant in the first water tank 220 has a temperature meet the burn-in testing requirement, such as in a range of 5° C.~25° C.

Figure 3:
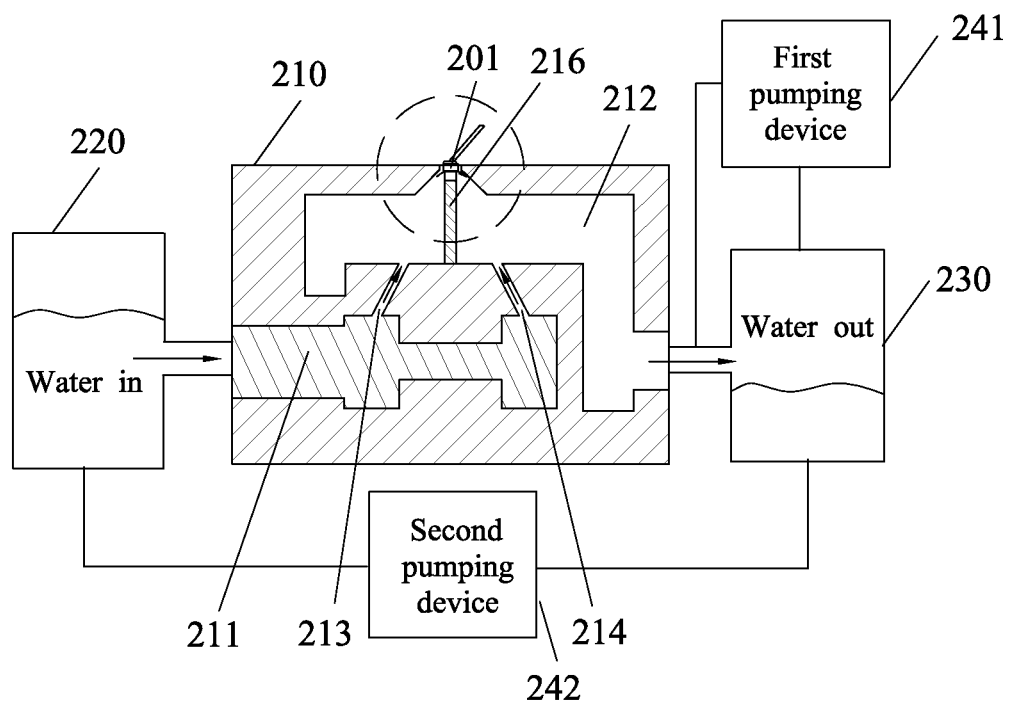
FIG. 3 is another schematic view of the system for cooling a semiconductor light source bar during burn-in testing shown in FIG. 2b.

Concretely, as shown in FIG. 3, the fixture 210 has a housing which includes a water inlet channel 211 connected with the first water tank 220, and a water outlet channel 212 communicated with the water inlet channel 211 via two channels 213, 214. Preferably, a water inlet 2111 of the water inlet channel 211 is formed at one side of the fixture 210, and a water outlet 2121 of the water outlet channel 212 is formed at an opposite side of the fixture 210.

Figure 4:
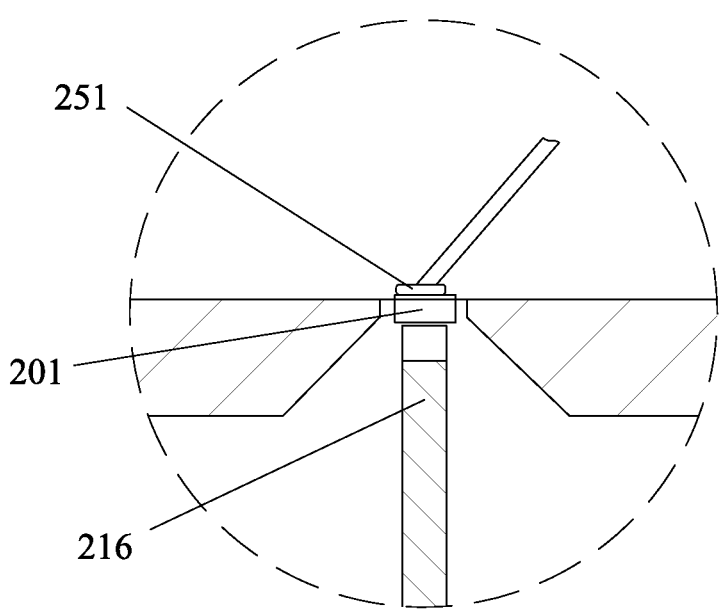
FIG. 4 is an enlarged cross-sectional view of a fixture of the system shown in FIG. 3.

As shown in FIGS. 3 and 4, a through hole 215 is formed on the housing of the fixture 210, which is communicated with the water outlet channel 212. And the housing of the fixture 210 has a support post 216 extended from the bottom of the water outlet channel 212 and faced opposite to the through hole 215. The semiconductor light source bar 201 is supported by the support post 216, whose bottom is faced to the support post 216 and top is connected to a probe 251 to carry out the burn-in testing.

Figure 2B:
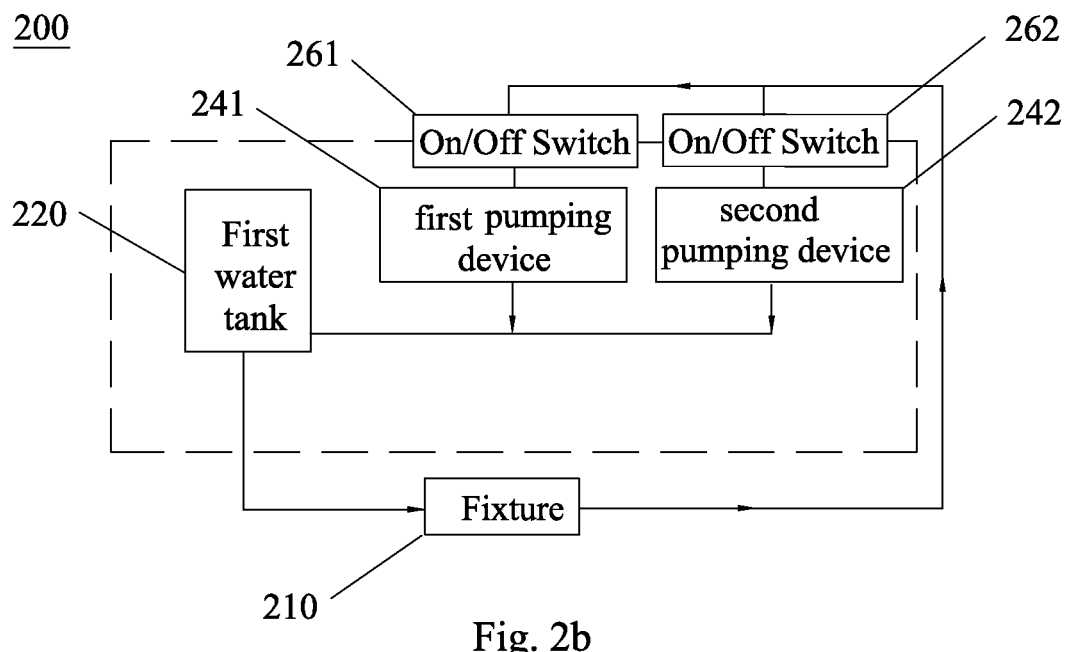
FIG. 2b is a schematic view of a system for cooling a semiconductor light source bar during burn-in testing according to a second embodiment of the present invention.

As a preferred embodiment, as shown in FIG. 2b, the pumping device 240 includes a first pumping device 241 connected with the water outlet channel 212 and the second water tank 230 for pumping the coolant from the first water tank 220 to the second water tank 230, and a second pumping device 242 formed between the first water tank 220 and the second water tank 230 for pumping the coolant from the second water tank 230 to the first water tank 220. Specifically, the system 200 further includes at least one control switch for controlling the alternate use between the first pumping device 241 and the second pumping device 242. Concretely, as shown in FIG. 2b, two control switches 261, 262 are connected to the first pumping device 241 and the second pumping device 242 respectively, so as to control their on or off.

The system 200 of the present invention is applicable to use during the burn-in testing of the semiconductor light source bar 201. Combining with FIGS. 3 and 4, when the system 200 operates, the control switch 261 controls the first pumping device 241 to work. The semiconductor light source bar 201 is held by the fixture 210 firmly as negative pressure is applied in the fixture 210, namely the water outlet channel 212 and the water inlet channel 211. Meanwhile, the coolant in the first water tank 220 is pumped through the water inlet channel 211, two channels 213, 214 and the water outlet channel 212 in turns, and finally infused into the second water tank 230.

When the coolant flows through the water outlet channel 212 continuously, as the semiconductor light source bar 201 is held on the through hole 215 connected with the water outlet channel 212, thus the bottom of the semiconductor light source bar 201 may be rushed and washed by the coolant continuously. As a result, a local heat of the semiconductor light source bar 201 generated during the burn-in testing can be dispersed quickly, and the local high temperature of the semiconductor light source bar 201 can be decreased and more uniform. Furthermore, as the coolant has a predetermined temperature which meets the requirement of the burn-in testing, thus the burn-in testing can be carried out successfully. In addition, due to the negative pressure is kept within the fixture 210, thus the semiconductor light source bar 201 could be held firmly without the coolant leak out from the through hole 215 during the operation process.

Figure 5:
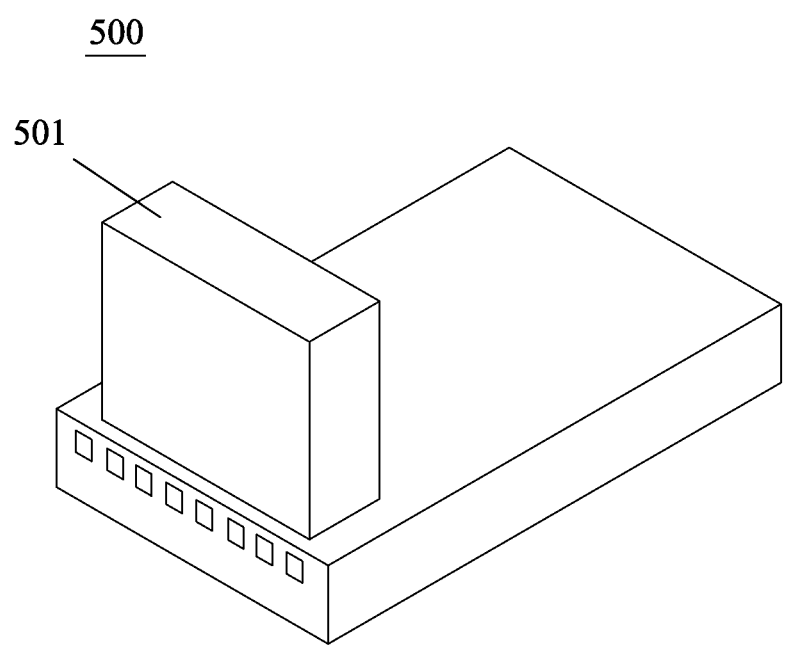
FIG. 5 is a perspective view of a slider with a HAMR head which has a laser diode chip formed thereon.

Alternatively, the semiconductor light source bar 201 can be a laser diode bar, an ultraviolet source bar, etc. And such a semiconductor light source bar 201 is applicable to any electronic product that needs it. For example, as shown in FIG. 5, a slider 500 with an HAMR head in which a laser diode chip 501 made by a laser diode bar is embedded. Due to the laser diode bar has an improved performance (such as uniform temperature, uniform heat energy) during the burn-in testing, thus the slider 500 can obtain an improved heat stability, therefore obtain an improved writing performance. As a result, such a slider 500 can be used in a disk drive unit to obtain a good performance. Of course, the semiconductor light source bar 201 such as the laser diode bar can be applicable to any electronic product that needs it, which is not limited here.

Figure 6:
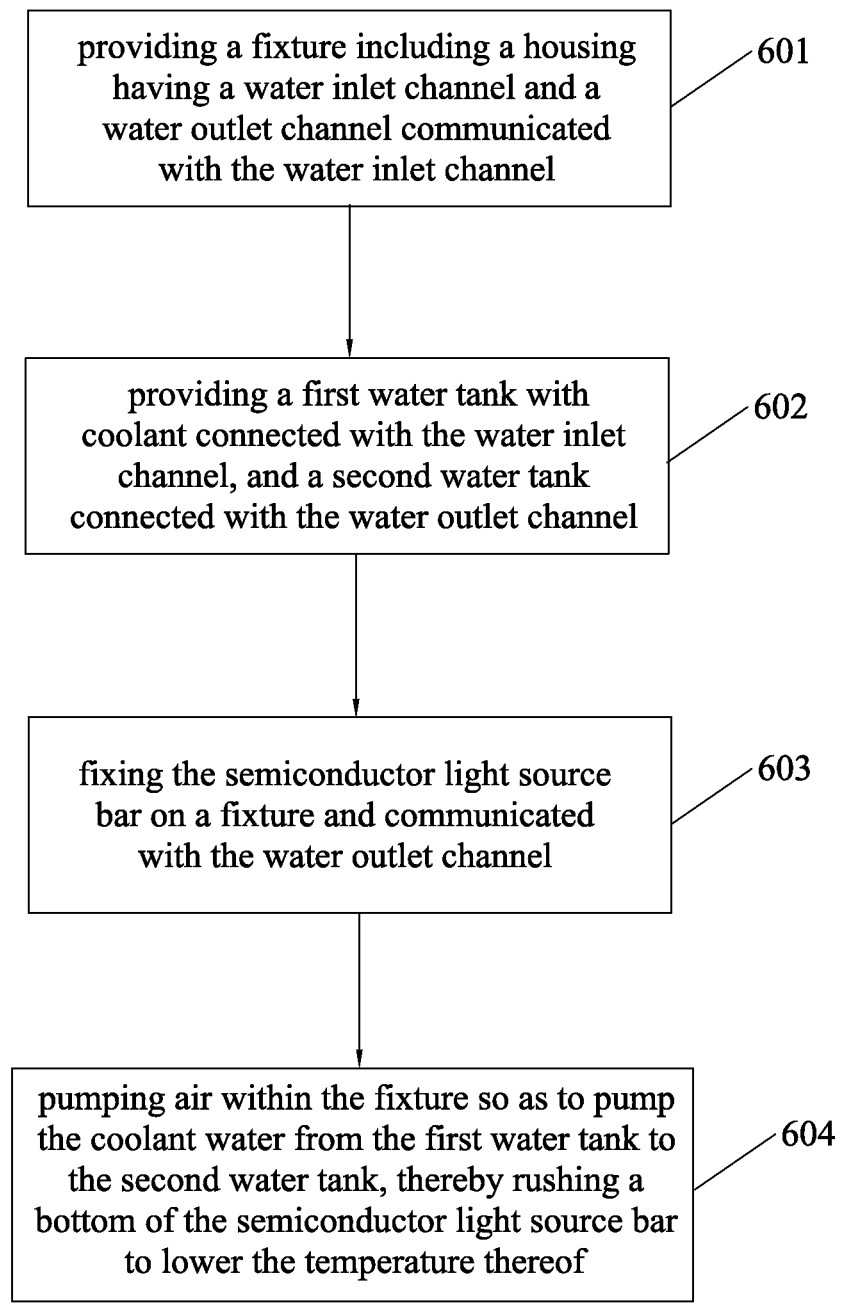
FIG. 6 is a flowchart of a method for cooling a semiconductor light source bar during burn-in testing according to an embodiment of the present invention.

Accordingly, FIG. 6 is a flowchart of a method for cooling a semiconductor light source bar during burn-in testing according to an embodiment of the present invention. As shown, the method includes:

Step (601), providing a fixture including a housing having a water inlet channel and a water outlet channel communicated with the water inlet channel;

Step (602), providing a first water tank with coolant connected with the water inlet channel, and a second water tank connected with the water outlet channel;

Step (603), fixing the semiconductor light source bar on a fixture and communicated with the water outlet channel; and Step (604), pumping air within the fixture so as to pump the coolant water from the first water tank to the second water tank, thereby rushing a bottom of the semiconductor light source bar to lower the temperature thereof.

Preferably, the method further includes pumping the coolant from the second water tank to the first water tank when all coolant is pumped to the second water tank.

When the cooling process starts, the coolant in the first water tank is pumped through the water inlet channel and the water outlet channel in turns, and finally infused into the second water tank. When the coolant flows through the water outlet channel continuously, as the semiconductor light source bar is connected with the water outlet channel, thus the bottom of the semiconductor light source bar may be rushed and washed by the coolant continuously. As a result, a local heat of the semiconductor light source bar generated during the burn-in testing can be dispersed quickly, and the local high temperature of the semiconductor light source bar can be decreased and more uniform. Furthermore, the coolant has a predetermined temperature which meets the requirement of the burn-in testing, thus the burn-in testing can be carried out successfully. In addition, due to the negative pressure is kept within the fixture, thus the semiconductor light source bar could be held firmly without the coolant leak out from the through hole during the operation process.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A system for cooling a semiconductor light source bar during burn-in testing, comprising:
    a fixture for fixing and holding the semiconductor light source bar, and the fixture comprising a housing having a water inlet channel and a water outlet channel communicated with the water inlet channel;
    a first water tank with coolant connected with the water inlet channel;
    a second water tank connected with the water outlet channel; and
    a pumping device at least connected with the water outlet channel for pumping the coolant from the first water tank to the second water tank, thereby rushing a bottom of the semiconductor light source bar to lower the temperature thereof.

2. The system according to claim 1, wherein a through hole is formed on the housing and communicated with the water outlet channel, and a support post is extended from the water outlet channel and located opposite the through hole; the semiconductor light source bar is supported by the support post.

3. The system according to claim 2, wherein the bottom of the semiconductor light source bar is faced to the support post; and a top of the semiconductor light source bar is connected to a probe to carry out the burn-in testing.

4. The system according to claim 1, wherein the pumping device comprises a first pumping device connected with the water outlet channel and the second water tank for pumping the coolant from the first water tank to the second water tank, and a second pumping device formed between the first water tank and the second water tank for pumping the coolant from the second water tank to the first water tank.

5. The system according to claim 4, further comprising at least one control switch for controlling the alternate use between the first pumping device and the second pumping device.

6. The system according to claim 1, wherein the semiconductor light source bar is laser diode bar or ultraviolet source bar.

7. A method for cooling a semiconductor light source bar during burn-in testing, comprising steps of:
    providing a fixture comprising a housing having a water inlet channel and a water outlet channel communicated with the water inlet channel;
    providing a first water tank with coolant connected with the water inlet channel, and a second water tank connected with the water outlet channel;
    fixing the semiconductor light source bar on a fixture and communicated with the water outlet channel; and
    pumping air within the fixture so as to pump the coolant water from the first water tank to the second water tank, thereby rushing a bottom of the semiconductor light source bar to lower the temperature thereof.

8. The method according to claim 7, further comprising pumping the coolant from the second water tank to the first water tank when all coolant is pumped to the second water tank.

9. The method according to claim 7, wherein the semiconductor light source bar is laser diode bar or ultraviolet source bar.

* * * * *